(12) United States Patent
Frantz et al.

(10) Patent No.: US 6,347,735 B1
(45) Date of Patent: Feb. 19, 2002

(54) METHOD OF MANUFACTURE FOR EMBEDDED PROCESSING SUBSYSTEM MODULE

(75) Inventors: Robert H. Frantz, Plano; Ramon E. Helms, Richardson, both of TX (US)

(73) Assignee: Intelect Communications, Inc., Richardson, TX (US)

( * ) Notice: Subject to any disclaimer, the term of this patent is extended or adjusted under 35 U.S.C. 154(b) by 0 days.

(21) Appl. No.: 09/712,098

(22) Filed: Nov. 14, 2000

Related U.S. Application Data

(62) Division of application No. 09/160,957, filed on Sep. 25, 1998, now Pat. No. 6,285,558.

(51) Int. Cl.[7] .......................... B23K 31/02; H05K 3/20; H05K 3/34
(52) U.S. Cl. ..................... 228/180.22; 228/246; 29/831; 29/840
(58) Field of Search .................. 29/831, 840; 361/600, 361/679, 683, 684; 257/737, 738; 438/613; 228/180.22, 245, 246, 254, 256

(56) References Cited

U.S. PATENT DOCUMENTS

| | | | | |
|---|---|---|---|---|
| 5,456,004 A | * | 10/1995 | Swamy | |
| 5,477,933 A | * | 12/1995 | Nguyen | |
| 5,541,449 A | * | 7/1996 | Crane, Jr. et al. | |
| 5,576,519 A | * | 11/1996 | Swamy | |
| 5,760,469 A | * | 6/1998 | Higashiguchi et al. | |
| 5,897,334 A | * | 4/1999 | Ha et al. | |
| 5,906,042 A | * | 5/1999 | Lan et al. | |
| 5,982,633 A | * | 11/1999 | Jeansonne | |
| 5,991,185 A | * | 11/1999 | Hachiya | |
| 6,031,729 A | * | 2/2000 | Berkeley et al. | |
| 6,050,832 A | * | 4/2000 | Lee et al. | |
| 6,097,089 A | * | 8/2000 | Gaku et al. | |
| 6,107,683 A | * | 8/2000 | Castro et al. | |
| 6,114,751 A | * | 9/2000 | Kumakura et al. | |
| 6,181,004 B1 | * | 1/2001 | Koontz et al. | |
| 6,215,184 B1 | * | 4/2001 | Stearns et al. | |
| 6,265,767 B1 | * | 7/2001 | Gaku et al. | |

* cited by examiner

Primary Examiner—Tom Dunn
Assistant Examiner—Kiley Stoner
(74) Attorney, Agent, or Firm—Robert H. Frantz

(57) ABSTRACT

The inventive embedded processing subsystem module is adapted for backside circuit board assembly directly opposite of a specific microprocessor or Digital Signal Processor so that circuit groups such as memory banks and communications peripherals may utilize otherwise unused backside printed circuit board space underneath the processor device, and further so that high-speed signals interconnecting the processor and subsystem circuit devices traverse a minimized printed circuit track length.

4 Claims, 5 Drawing Sheets

Subsystem Module SideView

METHOD OF MANUFACTURE FOR EMBEDDED PROCESSING SUBSYSTEM MODULE

CROSS REFERENCE TO RELATED APPLICATIONS

This application is a divisional of 09/160,957, entitled "Embedded Programming Subsystem Module," filed on Sep. 25, 1998 by Robert H. Franz. et al. now U.S. Pat. No. 6,285,558.

TECHNICAL FIELD OF THE INVENTION

This invention relates to high speed and high density embedded processing systems which employ microprocessors and digital signal processors. The invention provides a Ball Grid Array module for which microprocessor companion electronics are assembled on a printed circuit board directly opposite of the microprocessor being supported, thereby reducing the board space necessary to implement the full processing circuit and reducing printed circuit board track lengths.

INCORPORATION BY REFERENCE

This application incorporates by reference the related parent application, USPTO Ser. No. 09/160,957, entitled, "Embedded Processing Subsystem Module," filed on Sep. 25, 1998 by Robert H. Frantz, et al.

BACKGROUND OF THE INVENTION

Embedded processing systems which employ microprocessors and digital signal processors ("SP") are well known within the art, as well as standard modular packaging schemes for subsystems. Typical subsystems including arrays or banks of memory devices, peripherals such as communications controllers, and clock circuits. Well known component packages and modules are specified by the Electronics Industries Alliance ("EIA") JEDEC Solid State Products Division, and include package types such as Plastic Quad Flat Pack ("PQFP"), Small Outline Integrated Circuit ("SOIC"), Ball Grid Array ("BGA"), and multi-device modules such as Single Inline Memory Module ("SIMM").

While microprocessors and DSP's have traditionally employed JEDEC standard packages, such as PQFP and BGA, the pin-to-signal assignments of a particular processor or DSP is determined by the manufacturer of the processor. Thus, two processors from different manufacturers which both utilize a particular BGA package will not necessarily have the power, ground, address, data, control, and other signals assigned to the same pins or balls on the package.

Further, as demands on board space have increased due to the need to build greater functionality into a particular form factor board, such as a VME or Peripheral Component Interconnect ("PCI") card, new methods of packaging groups of related components are needed to conserve board space.

Finally, as processor bus speeds have increased far beyond speeds of 100 MHz, the minimization of printed circuit board ("PCB") track lengths interconnecting microprocessor package pins to subsystem module pins in order to preserve signal integrity of high speed digital electrical signals has become increasingly important.

Therefore, there exists an need in the art for a embedded processor subsystem module which minimizes processor-to-module PCB track lengths and maximizes board space utilization. This subsystem module preferably employs standard JEDEC physical definition and requires only conventional assembly technology for PCB boards.

SUMMARY OF THE INVENTION

The object of the present invention is to provide an embedded processor subsystem module which minimizes processor-to-module PCB track lengths and maximizes board space utilization. This subsystem module employs a standard JEDEC Ball Grid Array footprint definition and requires only conventional assembly technology for PCB boards. The subsystem module ball-to-signal definitions use a "mirror image" definition of specific microprocessors or digital signal processors in order to allow the subsystem module to be mounted on the printed circuit board on the opposing PCB surface directly opposite of the processor or DSP, thereby providing a minimum track length for high speed signals and utilizing PCB board space "underneath" the processor which would ordinarily not be utilized.

BRIEF DESCRIPTION OF THE DRAWINGS

For a more complete understanding of the invention.

DETAILED DESCRIPTION OF THE INVENTION

In accordance with the objects of the invention set forth in the Summary of the Invention, the subsystem module employs a standard PCB footprint of a BGA, but employs a novel transposition of row or column pin definitions of the footprint. The subsystem pin-to-signal definitions can then be matched to a particular processors pin-to-signal definition to create a processor-specific subsystem such as banks of memory or peripherals such as Ethernet controllers.

The module thereby provides advantages over prior art modules in that space directly underneath the microprocessor on the opposite surface of the PCB on which the microprocessor is assembled can be used for the subsystem, and the high speed signal track lengths between the microprocessor and the subsystem module are minimized.

Figure 1:
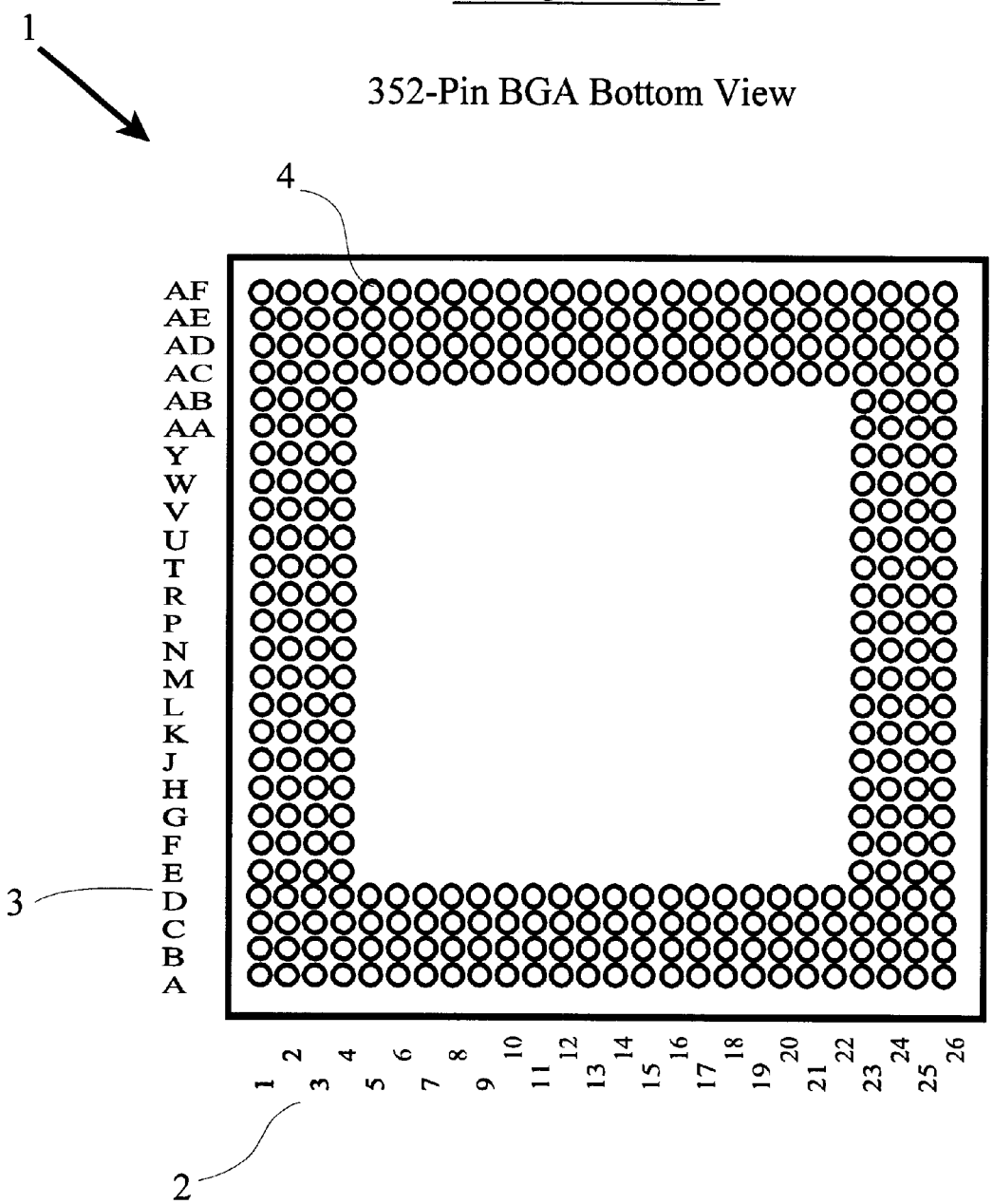
FIG. 1 shows a bottom view of a JEDEC standard 352-pin Ball Grid Array package.

Turning to FIG. 1, a bottom view of a standard JEDEC 352-pin BGA package (1) is shown. The bottom surface of the BGA is populated by solder balls (4) for interconnection to the printed circuit board. Under the standard JEDEC definition, the rows of balls are sequentially assigned letter references (3), skipping letters such as "I", "O", "Q", and "X" to avoid confusion with numbers and "don't care" values. The columns of balls are assigned number references (2) sequentially. A particular ball is referenced by the combination of row and column reference, such as the most upper left ball which is referenced as AF1. Microprocessors and DSP's manufacturers then freely assign signals to each of the balls using the alphanumeric ball reference designators. This allows the circuit designer to indicate to a PCB designer which signals must connect to which ball pads on the PCB. Manufacturer device specification sheets, or "spec sheets", typically contain tables which show ball-to-signal assignments. TABLE 1 shows the ball-to-signal definitions of the Texas Instruments TMS320C6× Digital Signal Processor for it's external memory interface ("EMIF"), including the data bus, address bus, and control signals.

TABLE 1

| SIGNAL NAME | BGA PIN NUMBER | SIGNAL DESCRIPTION |
|---|---|---|
| CE3 | AE22 | Memory space enable |
| CE2 | AD26 | " |
| CE1 | AB24 | " |
| CE0 | AC26 | " |
| BE3 | AB25 | Byte-enable control |
| BE2 | AA24 | " |
| BE1 | Y23 | " |
| BE0 | AA26 | " |
| EA21 | J26 | Memory Address |
| EA20 | K25 | " |
| EA19 | L24 | " |
| EA18 | K26 | " |
| EA17 | M26 | " |
| EA16 | M25 | " |
| EA15 | P25 | " |
| EA14 | P24 | " |
| EA13 | R25 | " |
| EA12 | T26 | " |
| EA11 | R23 | " |
| EA10 | U26 | " |
| EA9 | U25 | " |
| EA8 | T23 | " |
| EA7 | V26 | " |
| EA6 | V25 | " |
| EA5 | W26 | " |
| EA4 | V24 | " |
| EA3 | W25 | " |
| EA2 | Y26 | " |
| ED31 | AB2 | Memory Data |
| ED30 | AC1 | " |
| ED29 | AA4 | " |
| ED28 | AD1 | " |
| ED27 | AC3 | " |
| ED26 | AD4 | " |
| ED25 | AF3 | " |
| ED24 | AE4 | " |
| ED23 | AD5 | " |
| ED22 | AF4 | " |
| ED21 | AE5 | " |
| ED20 | AD6 | " |
| ED19 | AE6 | " |
| ED18 | AD7 | " |
| ED17 | AC8 | " |
| ED16 | AF7 | " |
| ED15 | AD9 | " |
| ED14 | AD10 | " |
| ED13 | AF9 | " |
| ED12 | AC11 | " |
| ED11 | AE10 | " |
| ED10 | AE11 | " |
| ED9 | AF11 | " |
| ED8 | AE14 | " |
| ED7 | AF15 | " |
| ED6 | AE15 | " |
| ED5 | AF16 | " |
| ED4 | AC15 | " |
| ED3 | AE17 | " |
| ED2 | AF18 | " |
| ED1 | AF19 | " |
| ED0 | AC17 | " |
| ARE | Y24 | Asynchronous memory read enable |
| AOE | AC24 | Asynchronous memory output enable |

TABLE 1-continued

| SIGNAL NAME | BGA PIN NUMBER | SIGNAL DESCRIPTION |
|---|---|---|
| AWE | AD23 | Asynchronous memory write enable |
| ARDY | W23 | Asynchronous memory ready input |
| SSADS | AC20 | SBSRAM address strobe |
| SSOE | AF21 | SBSRAM output enable |
| SSWE | AD19 | SBSRAM write enable |
| SSCLK | AD17 | SBSRAM clock |
| SDA10 | AD21 | SDRAM address 10 |
| SDRAS | AF24 | SDRAM row-address strobe |
| SDCAS | AD22 | SDRAM column-address strobe |
| SDWE | AF23 | SDRAM write enable |
| SDCLK | AE20 | SDRAM clock |
| HOLD | AA25 | Hold request from the host |
| HOLDA | A7 | Hold-request acknowledge to host |

TABLE 1 shows the memory interface signals for asynchronous memory, Synchronous Dynamic Random Access Memory ("SDRAM"), and Synchronous Burst RAM ("SBSRAM") which are specific to the TMS320C6× DSP. TABLE 2 shows the power supply and ground balls for the TMS320C6× DSP, which are also necessary for a subsystem module.

TABLE 2

| SIGNAL NAME | BGA PIN NUMBER | SIGNAL DESCRIPTION |
|---|---|---|
| DVDD | A10, A15, A18, A21, A22, | 3.3 VDC Voltage Supply |
| " | B7, B8, C1, D17, F3, G24, | 3.3 VDC Voltage Supply |
| " | G25, H25, J25, L25, M3, | 3.3 VDC Voltage Supply |
| " | N3, N23, R26, T24, U24, | 3.3 VDC Voltage Supply |
| " | Y4, AB3, AB4, AB26, AC6, | 3.3 VDC Voltage Supply |
| " | AC10, AC19, AC21, AC22, | 3.3 VDC Voltage Supply |
| " | AC25, AD11, AD13, AD15, | 3.3 VDC Voltage Supply |
| " | AD18, AE18, AE21, AF5, AF6, | 3.3 VDC Voltage Supply |
| " | AF17 | 3.3 VDC Voltage Supply |
| CVDD | A5, A12, A16, A20, B2, B6, | 1.8 or 2.5 VDC Voltage Supply |
| " | B11, B12, B25, C3, C15, C20, | 1.8 or 2.5 VDC Voltage Supply |
| " | C24, D4, D6, D7, D9, D14, | 1.8 or 2.5 VDC Voltage Supply |
| " | D18, D20, D23, E1, F1, H4, | 1.8 or 2.5 VDC Voltage Supply |
| " | J4, J23, K1, K23, M1, M24, N4, | 1.8 or 2.5 VDC Voltage Supply |
| " | N25, P2, P23, T3, T4, U1, V4, | 1.8 or 2.5 VDC Voltage Supply |
| VSS | D19, E3, E24, F2, F24, G3, G4, | 1.8 or 2.5 VDC Voltage Supply |
| " | G26, J3, L23, L26, M23, N1, N2, | 1.8 or 2.5 VDC Voltage Supply |
| " | N24, N26, P1, P26, R24, U2, | 1.8 or 2.5 VDC Voltage Supply |
| " | U23, V1, V3, Y3, Y25, AA3, | 1.8 or 2.5 VDC Voltage Supply |
| VSS | AA23, AB23, AC2, AC5, | Ground Supply |
| " | AC7, AC14, AC16, AD2, | " |
| " | AD12, AD16, AD20 | " |

The voltage and ground supply assignments shown in TABLE 2 are unique to the TMS320C6× DSP, as well.

Figure 2:
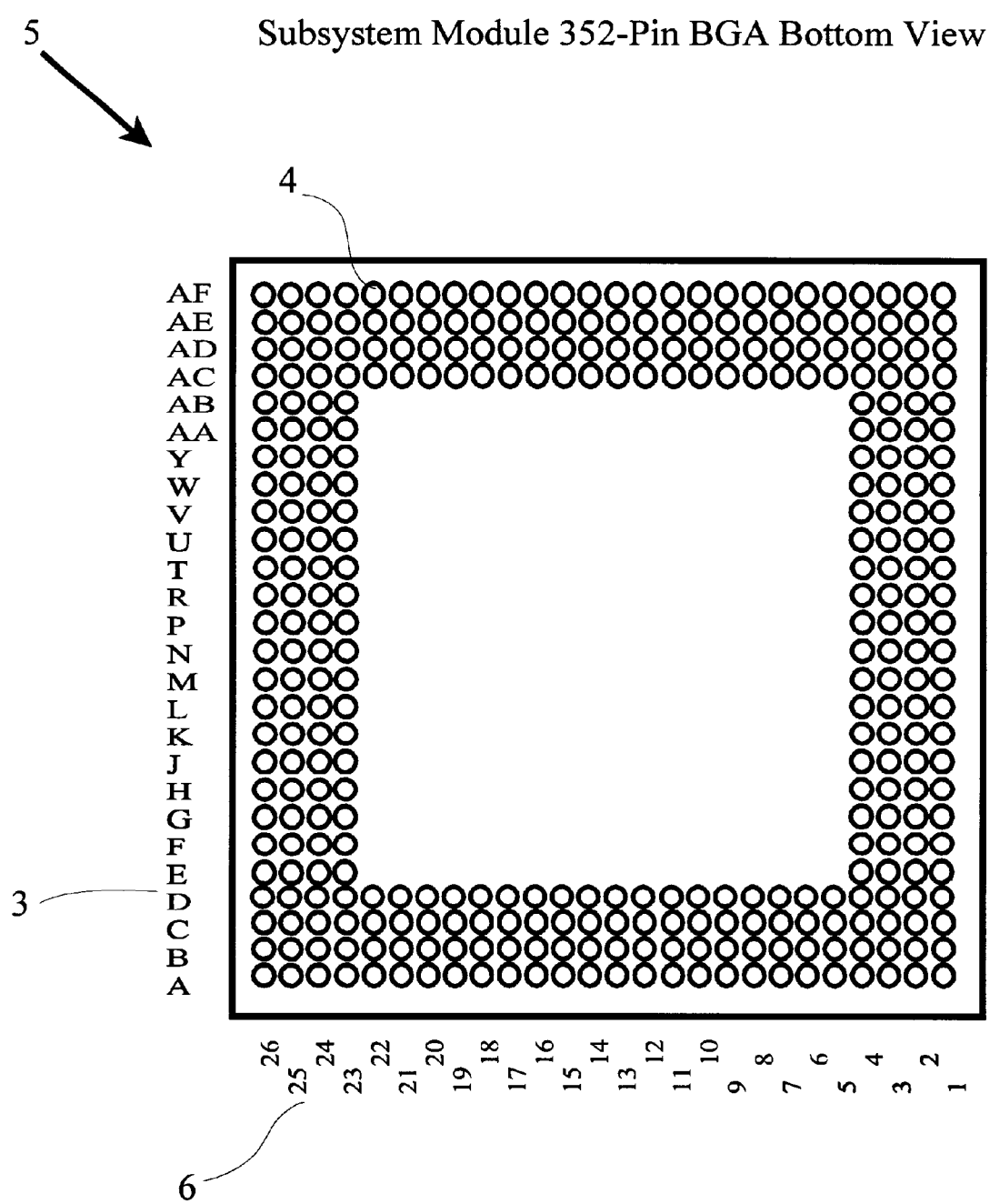
FIG. 2 depicts the bottom view of the inventive 352-pin BGA package with mirrored pin assignments for reverse-side assembly to a standard JEDEC 352-pin BGA.
Figure 3:
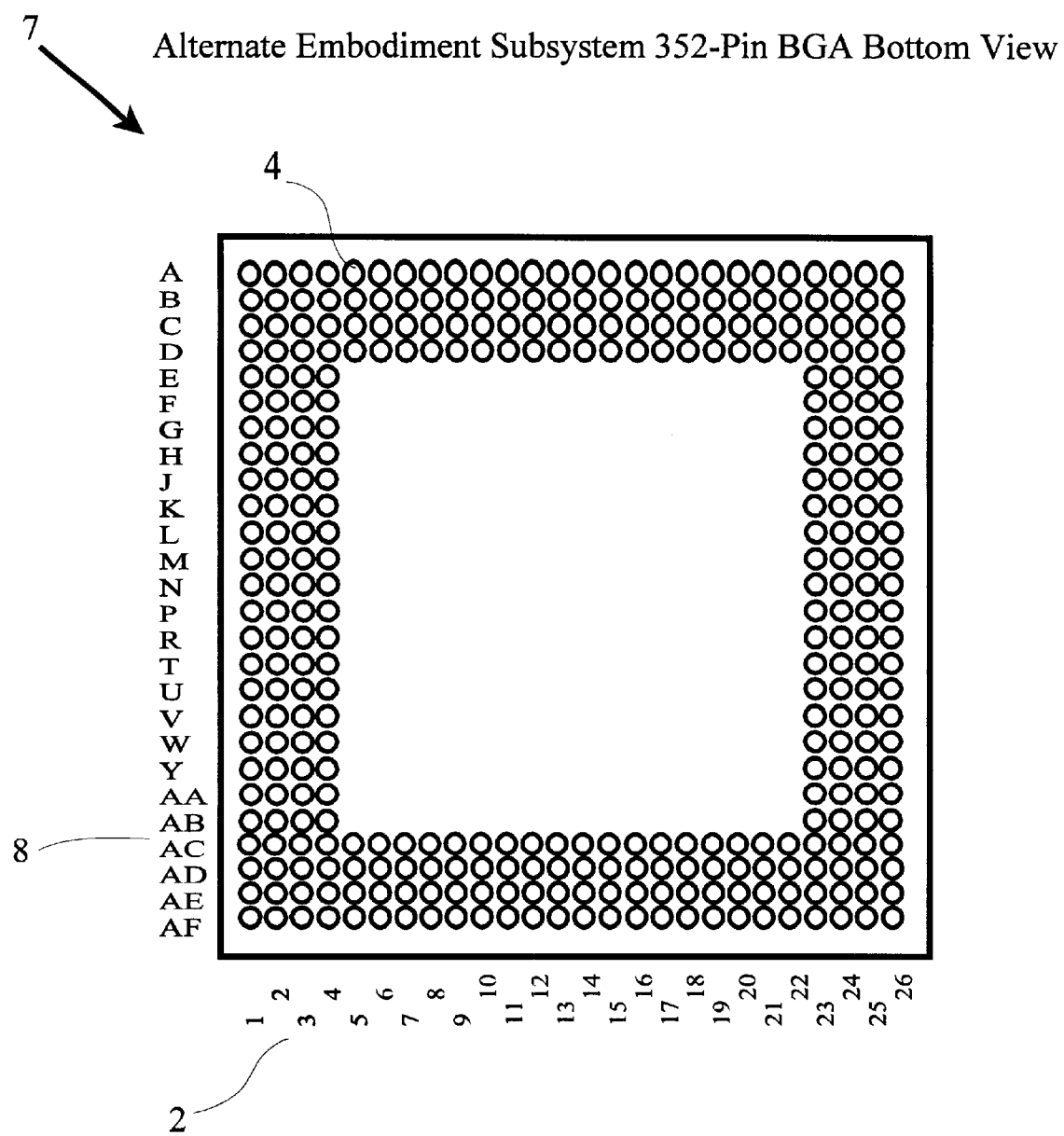
FIG. 3 shows a bottom view of an alternate embodiment of the inventive BGA module.

Turning now to FIG. 2, the subsystem (5) bottom view is shown, as well as the rows and columns of the balls of the BGA package. The subsystem BGA ball designators of the rows (3) are identical to those of the JEDEC standard package, although the subsystem column designators (6) are numbered in decrementing fashion from left to right, creating a one-dimensional mirror image of the standard JEDEC references of FIG. 1. FIG. 3 shows an alternate embodiment of the subsystem in which the columns (2) are identical to the JEDEC standard, but the rows (8) have been designated using an alphabetic sequence increasing from bottom to top and skipping "I", "O", "Q", and "X" so as to produce a one-dimensional mirror image of the standard JEDEC BGA package.

Figure 4:
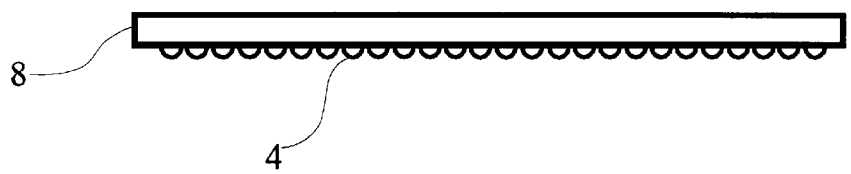
FIG. 4 discloses a side view of subsystem module.
Figure 6:
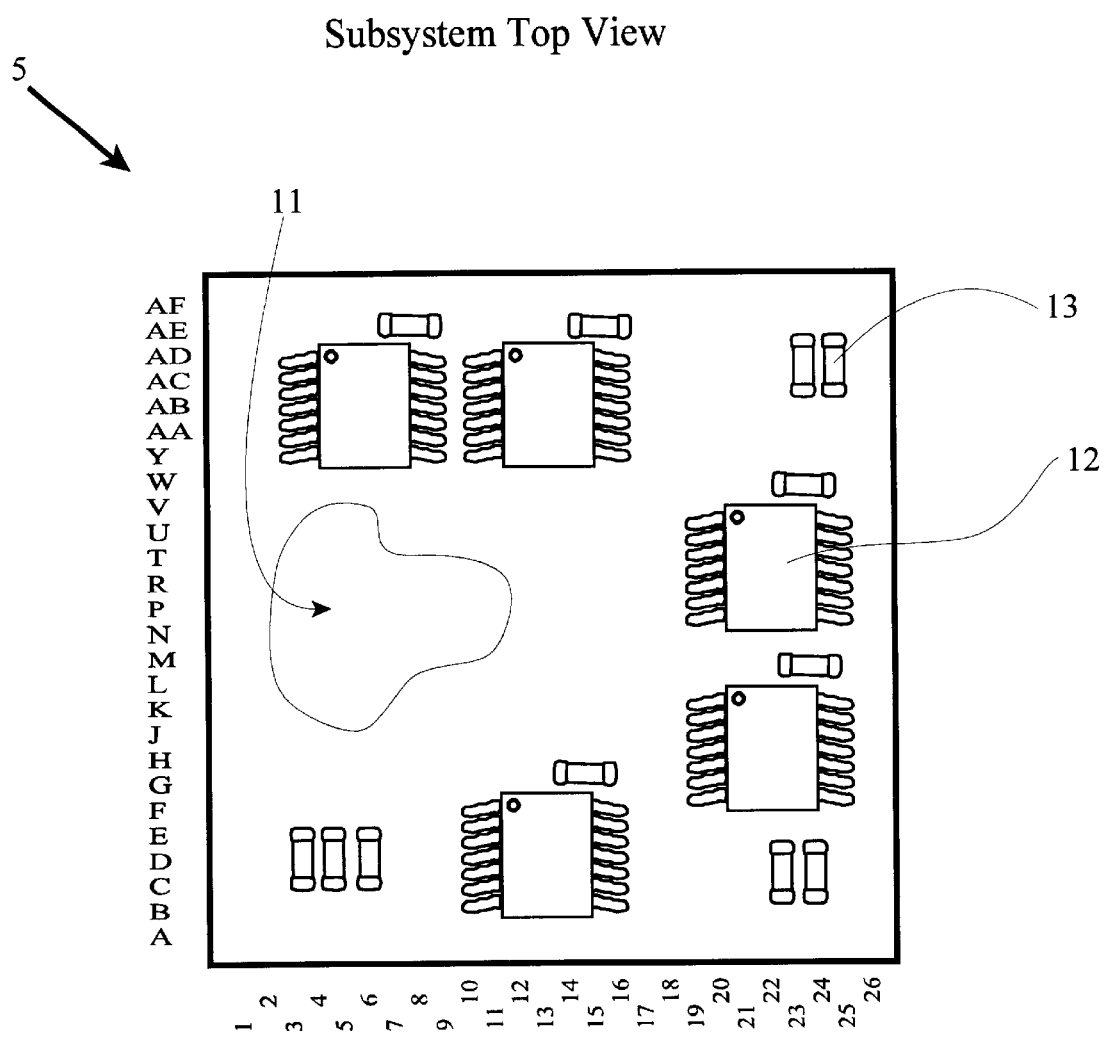
FIG. 6 shows the subsystem module from a top view, and illustrates a typical use of the top surface for subsystem circuits such as banks of memory devices, power supply filter capacitors, and other peripherals.

FIG. 6 shows a top view of the subsystem (5) wherein the top surface (11) is available for designer-defined circuitry of the subsystem, such as banks of memory devices (12) and power supply decoupling capacitors (13). In the preferred embodiment, the subsystem is constructed of an epoxy-glass multi-layer, double-sided printed circuit board substrate, with the ball pattern of FIG. 2 or FIG. 3 on the bottom side and the user-defined circuit on the module substrate top surface (11). FIG. 4 shows a side view of the subsystem without user-specific components on the top, including the module substrate (8) with balls on the bottom side (4).

Figure 5:
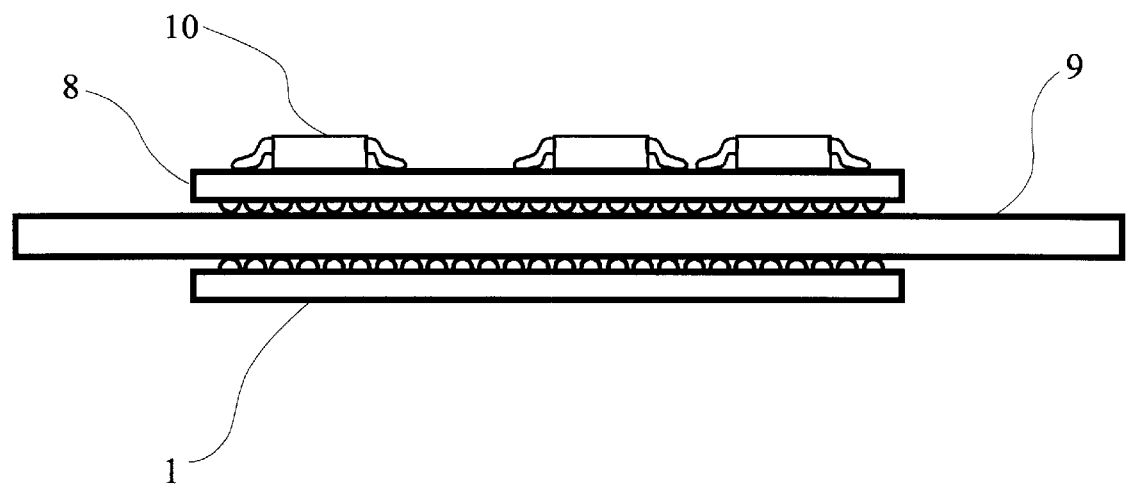
FIG. 5 illustrates the inventive subsystem module assembled on a printed circuit board directly opposite of the microprocessor, shown from a side view of the assembled board.

FIG. 5 depicts the preferred embodiment fully assembled with the components of the user-defined circuit (10) mounted on the module substrate (8), and with the processor (1) mounted on the opposite side of the system printed circuit board (9). In the preferred embodiment, the processor (1) is the TMS320C6× DSP and the user-defined circuits (10) are external memory devices such as SDRAM or SBSRAM, which would also use the ball-to-signal definitions of TABLE 1 and TABLE 2.

The preceding disclosure has set forth particular details of the inventive embedded processing subsystem module and it's method of construction. However, it will be understood by those skilled in the art that various changes in the form and details may be adopted without departing from the spirit and scope of the invention. For example, the ball-to-signal definitions adopted for the subsystem module may be those of another DSP or microprocessor in order to yield a subsystem for specific use with another DSP or processor.

Alternatively, the user-defined circuit and components could be communications controllers such as Universal Asynchronous Receiver and Transmitter ("UART"), Universal Serial Bus ("USB"), and Ethernet devices. Also, the mirror-reversing method could be applied to the pin definitions of other BGA packages or Pin Grid Array Packages ("PGA").

We claim:

1. A method of assembling an embedded processing subsystem module comprising the steps of:

fabricating an epoxy-glass multi-layer printed circuit substrate having a top surface on which an electrically conductive pattern is deposited suitable for receiving one or more electronic components by soldering, a bottom surface on which an electrically conductive ball grid array pattern is formed suitable for receiving solder balls, and a network of printed circuit tracks electrically interconnecting said top surface pattern and said bottom surface pattern such that said bottom surface pattern is compatible with a one-dimensionally transposed signal definition with a specific microprocessor;

assembling one or more electronic components on said substrate top surface by soldering; and forming solder balls by depositing solder on said bottom side conductive pattern.

2. The method of assembling an embedded processing subsystem module as set forth in claim 1 wherein said transposed signal definition is compatible with a Texas Instruments TMS320C6× Digital Signal Processor.

3. The method of assembling an embedded processing subsystem module as set forth in claim 1 wherein said electronic components assembled on said top surface of said substrate further comprise electronic memory devices.

4. The method of assembling an embedded processing subsystem module as set forth in claim 1 wherein said electronic components assembled on said top surface of said substrate further comprise communication controller devices.

* * * * *